(12) United States Patent
Coffy et al.

(10) Patent No.: US 10,941,921 B2
(45) Date of Patent: Mar. 9, 2021

(54) PROTECTION MECHANISM FOR LIGHT SOURCE

(71) Applicant: STMICROELECTRONICS (GRENOBLE 2) SAS, Grenoble (FR)

(72) Inventors: Romain Coffy, Voiron (FR); Jean-Michel Riviere, Froges (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 16/552,419

(22) Filed: Aug. 27, 2019

(65) Prior Publication Data

US 2020/0072446 A1    Mar. 5, 2020

(30) Foreign Application Priority Data

Aug. 31, 2018   (FR) ..................... 18 57833

(51) Int. Cl.
| | |
|---|---|
| *F21V 17/10* | (2006.01) |
| *F21V 23/00* | (2015.01) |
| *F21V 17/08* | (2006.01) |
| *F21V 3/04* | (2018.01) |

(Continued)

(52) U.S. Cl.
CPC ............ *F21V 17/101* (2013.01); *F21V 3/049* (2013.01); *F21V 17/06* (2013.01); *F21V 17/08* (2013.01); *F21V 23/001* (2013.01); *F21Y 2115/30* (2016.08)

(58) Field of Classification Search
CPC ........ F21V 17/101; F21V 17/08; F21V 17/06; F21V 23/001; F21V 3/049; F21V 25/04; F21V 19/00; F21V 19/001; F21V 19/0025; F21V 19/003; F21V 19/005; F21Y 2115/30; F21K 9/00; H01S 5/06825;

(Continued)

(56) References Cited

U.S. PATENT DOCUMENTS

| | | |
|---|---|---|
| 6,778,574 B1 | 8/2004 | Shimonaka et al. |
| 6,816,523 B1 | 11/2004 | Glenn et al. |
| 7,942,556 B2 | 5/2011 | Harbers et al. |

(Continued)

FOREIGN PATENT DOCUMENTS

| | | |
|---|---|---|
| CN | 101626026 A | 1/2010 |
| CN | 104254798 A | 12/2014 |

(Continued)

OTHER PUBLICATIONS

Ablestik, Technical Data Sheet, Ablebond 8387B, Jul. 2010, 2 pages.

(Continued)

*Primary Examiner* — Joseph L Williams
*Assistant Examiner* — Jose M Diaz
(74) *Attorney, Agent, or Firm* — Seed Intellectual Property Law Group LLP

(57) ABSTRACT

The present disclosure relates to a light-emitting device comprising: a light source mounted on a substrate; a wire for providing a supply voltage or activation signal to the light source; a cap covering the light source and having a diffuser adapted to diffuse light generated by the light source; and either: a volume of glue fixing an intermediate section of the wire to the cap; or an arm fixed to the cap and extending between the intermediate section of the wire and the substrate.

19 Claims, 3 Drawing Sheets

(51) Int. Cl.
*F21V 17/06* (2006.01)
*F21Y 115/30* (2016.01)

(58) Field of Classification Search
CPC ............ H01S 5/02228; H01S 5/02296; H01S 5/02208; H01S 5/02276; H01S 5/005
See application file for complete search history.

(56) References Cited

U.S. PATENT DOCUMENTS

| | | | |
|---|---|---|---|
| 8,672,517 B2 | 3/2014 | Chung et al. | |
| 8,770,774 B2 | 7/2014 | Ye et al. | |
| 8,820,950 B2 * | 9/2014 | Matsuda | H05B 45/56 362/84 |
| 9,086,209 B2 | 7/2015 | Park et al. | |
| 9,386,202 B2 | 7/2016 | Son | |
| 10,066,808 B2 | 9/2018 | Fernando | |
| 10,290,993 B2 | 5/2019 | Chen et al. | |
| 2005/0087750 A1 * | 4/2005 | Braddell | H01L 25/0753 257/89 |
| 2005/0190553 A1 | 9/2005 | Lynch et al. | |
| 2005/0226636 A1 | 10/2005 | Hiramatsu et al. | |
| 2005/0254246 A1 | 11/2005 | Huang | |
| 2007/0085101 A1 | 4/2007 | Kim | |
| 2008/0087911 A1 * | 4/2008 | Stoyan | H05K 1/021 257/99 |
| 2009/0212306 A1 | 8/2009 | Bogner et al. | |
| 2009/0321774 A1 | 12/2009 | Ishi et al. | |
| 2010/0073907 A1 | 3/2010 | Wanninger et al. | |
| 2011/0122303 A1 | 5/2011 | Bonkohara | |
| 2011/0199530 A1 | 8/2011 | Kosaka et al. | |
| 2011/0199766 A1 * | 8/2011 | Shibusawa | F21V 7/28 362/235 |
| 2012/0051056 A1 | 3/2012 | Derks et al. | |
| 2012/0161193 A1 * | 6/2012 | Hassan | F21K 9/00 257/99 |
| 2012/0268932 A1 * | 10/2012 | Lerman | F21K 9/90 362/235 |
| 2013/0163627 A1 | 6/2013 | Seurin et al. | |
| 2015/0009682 A1 | 1/2015 | Clough | |
| 2015/0117010 A1 | 4/2015 | Auen | |
| 2015/0292724 A1 | 10/2015 | Griffoni et al. | |
| 2015/0330616 A1 | 11/2015 | Preuschl et al. | |
| 2015/0338079 A1 | 11/2015 | Preuschl et al. | |
| 2015/0369456 A1 | 12/2015 | Creusen et al. | |
| 2018/0014377 A1 | 1/2018 | Steinkamp et al. | |
| 2018/0093698 A1 | 4/2018 | Urimoto et al. | |
| 2019/0128482 A1 * | 5/2019 | Jiang | F21K 9/232 |
| 2019/0376666 A1 | 12/2019 | Coffy et al. | |
| 2019/0376667 A1 | 12/2019 | Coffy et al. | |
| 2019/0376676 A1 | 12/2019 | Hannan et al. | |
| 2019/0379173 A1 | 12/2019 | Coffy et al. | |

FOREIGN PATENT DOCUMENTS

| | | |
|---|---|---|
| CN | 105229874 A | 1/2016 |
| CN | 106663733 A | 5/2017 |
| CN | 107210583 A | 9/2017 |
| CN | 107251242 A | 10/2017 |
| CN | 107608167 A | 1/2018 |
| DE | 102017207224 A1 | 10/2018 |
| EP | 1746692 A2 | 1/2007 |
| EP | 2677237 A2 | 12/2013 |
| EP | 2942561 A1 | 11/2015 |
| JP | 2005197142 A | 7/2005 |
| WO | 2017/210078 A1 | 12/2017 |

OTHER PUBLICATIONS

U.S. Appl. No. 16/439,308, filed Jun. 12, 2019, Housing for Light Source.
U.S. Appl. No. 16/432,561, filed Jun. 5, 2019, Protection Mechanism for Light Source.
U.S. Appl. No. 16/432,576, filed Jun. 5, 2019, Protection Mechanism for Light Source.
U.S. Appl. No. 16/432,577, filed Jun. 5, 2019, Protection Mechanism for Light Source.

* cited by examiner

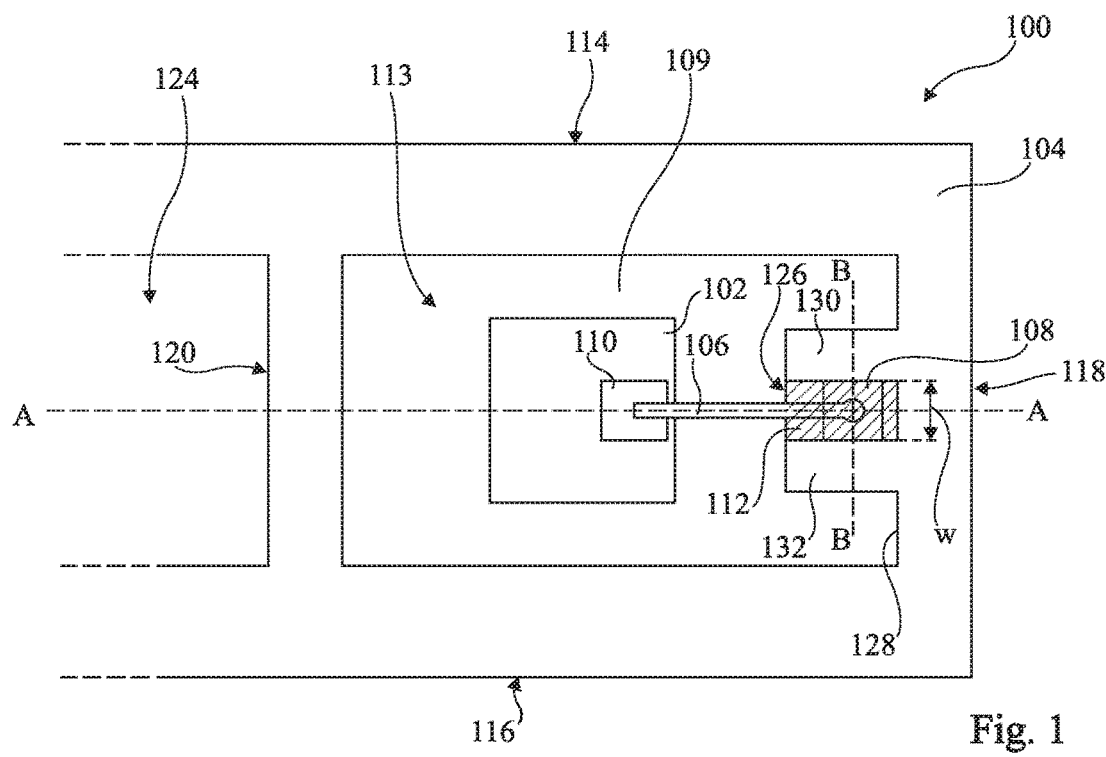
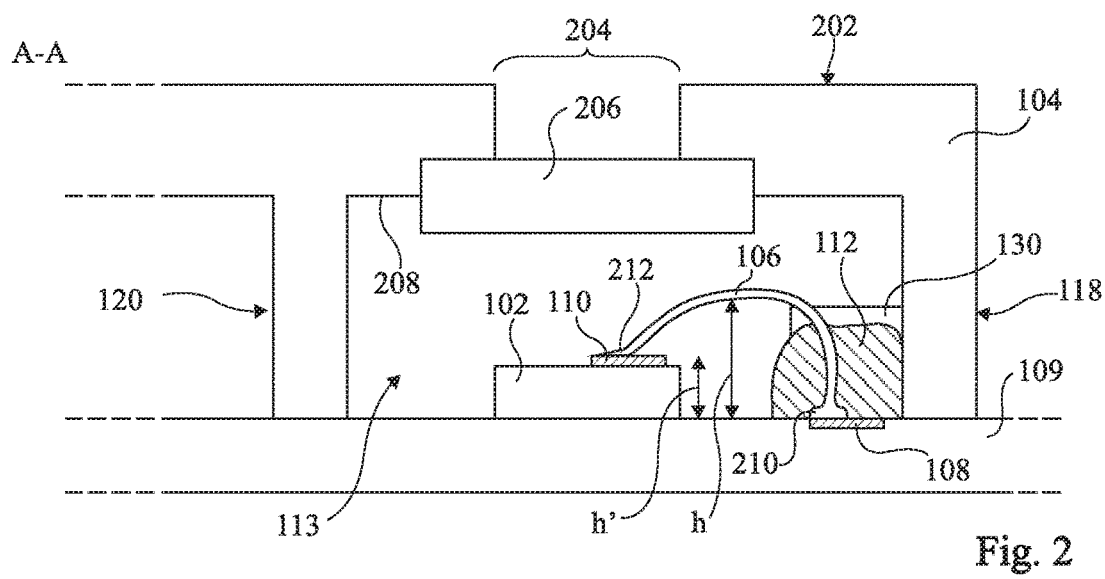
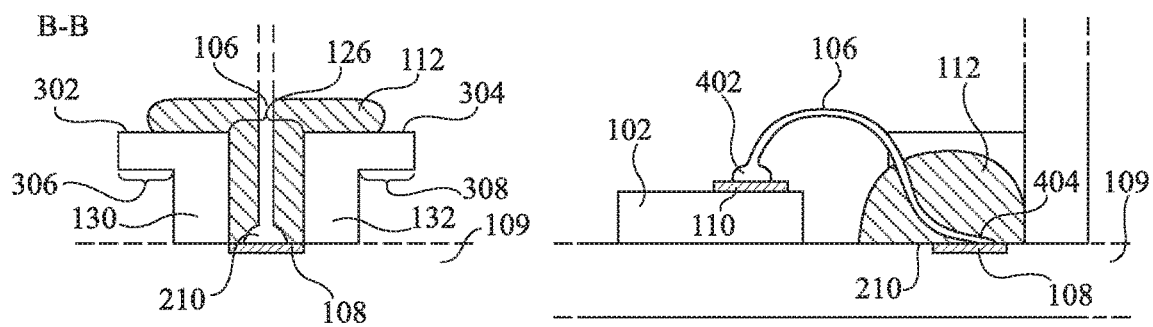
Fig. 1
Fig. 2
Fig. 3          Fig. 4

PROTECTION MECHANISM FOR LIGHT SOURCE

BACKGROUND

Technical Field

The present disclosure relates to the field of electronic devices comprising light sources, and in particular to a cap for a light source.

Description of the Related Art

For certain applications, electronic devices may comprise light sources. For example, ranging devices, such as proximity sensors, often use lasers to generate light beams aimed at one or more objects in an image scene, and the reflected light is used to determine the distance of the object from the ranging device.

The power and type of the light source will depend on the specific application, but generally the higher the power and the narrower the light beam, the greater the distance that can be measured.

The light source used to generate the light beam is generally covered by a diffuser that spreads the beam and thereby reduces to some extent its intensity. As such, the light beam is generally not considered harmful to the user. However, if the diffuser becomes detached or is otherwise removed from the device, the intensity of the light source may be such that it risks causing harm, for example to a user's eyes.

There is a need in the art for a technical solution for reducing the risk of harm in electronic devices comprising such light sources.

BRIEF SUMMARY

One or more embodiments of the present disclosure are directed to electronic devices comprising light sources, and in particular to a cap for covering a light source.

According to one aspect, there is provided a light-emitting device comprising a light source mounted on a substrate; a wire providing a supply voltage or activation signal to the light source, the wire having a first end bonded to a contact region of the substrate, a second end bonded to a contact region on a surface of the light source, and an intermediate section linking the first and second ends and extending over a surface of the substrate; a cap covering the light source and having a diffuser adapted to diffuse light generated by the light source; and either: a volume of glue fixing the intermediate section of the wire to the cap; or an arm fixed to the cap and extending between the intermediate section of the wire and the substrate.

According to one embodiment, the light-emitting device comprises the volume of glue contacting at least two surfaces of the cap.

According to one embodiment, a total contact area between the volume of glue and the cap is greater than a contact area between the volume of glue and the substrate.

According to one embodiment, the total contact area between the volume of glue and the cap is at least 50 percent greater than the contact area between the volume of glue and the substrate.

According to one embodiment, the cap comprises a well for receiving the glue, the wire passing through the well.

According to one embodiment, the well has an opening in an exterior surface of the cap.

According to one embodiment, the light-emitting device comprises the arm having at least one of its ends fixed to the cap.

According to one embodiment, the cap comprises a through-hole, and one end of the arm extends at least partially into the through-hole.

According to one embodiment, the end of the arm that extends at least partially into the through-hole is glued to the cap in the through-hole.

According to one embodiment, another end of the arm extends at least partially into a further through-hole in the cap.

According to a further aspect, there is provided an assembly method of a light-emitting device, the method comprising: bonding a first end of a wire to a contact region of a substrate and a second end of the wire to a contact region on a surface of a light source mounted on the substrate, an intermediate section of the wire linking the first and second ends and extending over a surface of the substrate, the wire providing a supply voltage or activation signal to the light source; and fixing a cap to the substrate, the cap covering the light source and comprising a diffuser adapted to diffuse light generated by the light source, wherein a volume of glue fixes the intermediate section of the wire to the cap or an arm is fixed to the cap and extends between the intermediate section of the wire and the substrate.

According to one embodiment, the method further comprises, before fixing the cap to the substrate: depositing a liquid glue over a portion of the intermediate section of the wire; placing the cap on the substrate such that at least two surface of the cap are brought into contact with the liquid glue; and solidifying the liquid glue to form the volume of glue.

According to one embodiment, the method further comprises: injecting a liquid glue into an opening in an exterior surface of the cap to at least partially fill a well within the cap through which the wire passes; and solidifying the liquid glue to form the volume of glue.

According to one embodiment, the method further comprises, before fixing the cap to the substrate: positioning the arm on the surface of the substrate such that it at least partially extends between the intermediate section of the wire and the surface of the substrate; and placing the cap on the substrate such that at least one end of the arm extends at least partially into a through-hole in the cap.

According to one embodiment, the method further comprises gluing the at least one end of the arm to the cap in the through-hole.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which:

FIG. 1 is a plan view of part of a light-emitting device according to an example embodiment of the present disclosure;

FIG. 2 is a cross-section view of the light-emitting device of FIG. 1 according to an example embodiment;

FIG. 3 is a cross-section view of a glue well of a cap of the light-emitting device of FIGS. 1 and 2 according to an example embodiment;

FIG. 4 is cross-section view of a wire of the light-emitting device of FIG. 1 according to an alternative embodiment to that of FIG. 2;

DETAILED DESCRIPTION

Figure 5:
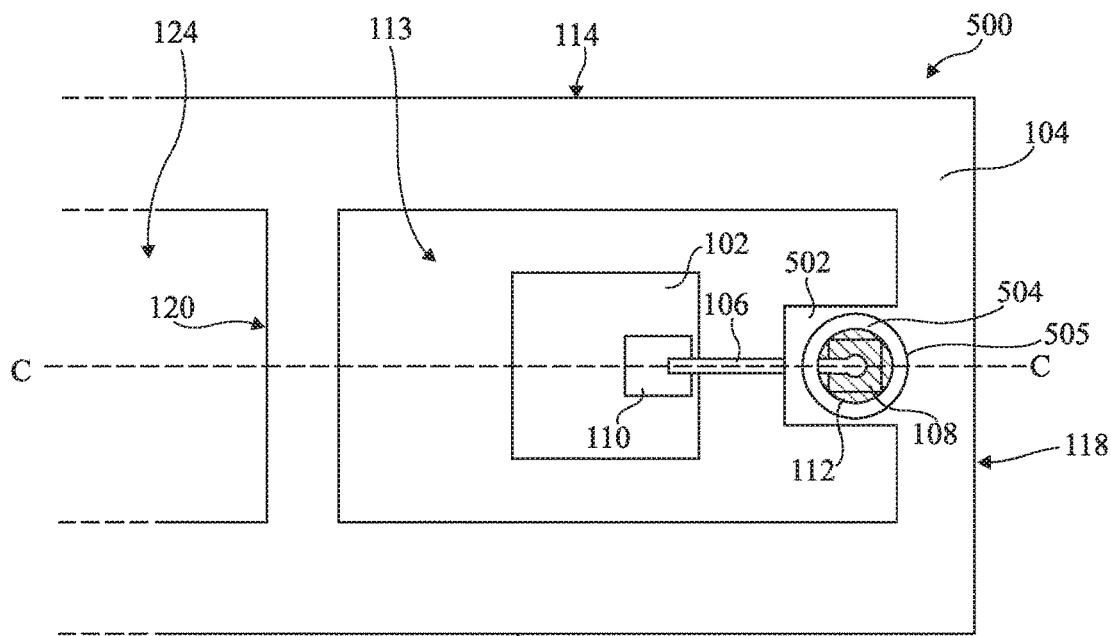
FIG. 5 is a plan view of part of a light-emitting device according to a further example embodiment of the present disclosure.

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The term "diffuser" is used herein to designate any element formed of a material that is relatively transparent to the wavelengths of the light beam that it is to diffuse. For example, a diffuser has a transmission rate of 90 percent or more for these wavelengths. A diffuser may be formed of a solid single material, or may be formed by assembling multiple materials, in which case a part of the diffuser may be transparent. For example, the diffuser is formed of glass or plastic. The transmission surfaces of the diffuser are for example planar. Alternatively, either or both of the transmission surfaces could be non-planar in order to enhance the diffusion effect and/or to perform other optical functions.

FIG. 1 is a plan view of part of a light emitting device 100 according to an example embodiment.

The light-emitting device 100 comprises a light source 102, which is for example a laser, such as a vertical-cavity surface-emitting laser (VCSEL). The light source 102 for example has a power of over 1 W. The light source 102 is covered by a cap 104, part of which is shown in FIG. 1. The light source 102 is powered and/or controlled via a wire 106. The wire 106 for example has a diameter or thickness of 25 μm or less. The wire 106 has one of its ends bonded to a contact region 108 of the substrate 109 on which the light source 102 is mounted. The other end of the wire 106 is bonded to a contact region 110 on a surface of the light source 102, which is for example a top surface of the light source 102. An intermediate section of the wire 106 between its ends for example passes through a volume of glue 112 attached to the cap 104, the glue being represented by a shaded region in FIG. 1.

The cap 104 for example has opaque walls defining a chamber 113 within which the light source 102 is mounted. The chamber 113 is substantially rectangular in plan view, the cap 104 for example comprising substantially parallel walls 114, 116 facing each other, and further walls 118, 120 also facing each other and extending between the walls 114, 116, thereby closing the ends of the chamber 113. In some embodiments, the wall 120 is an interior wall that separates the chamber 113 containing the light source 102 from another adjacent chamber 124 containing an image sensor or the like.

The glue 112 is for example a non-conductive glue. As one example, the glue 112 could correspond to the one marketed as LOCTITE ABLESTIK ABP 8420 by the company Henkel AG & Co. (the names "Henkel", "LOCTITE" and "ABLESTIK" may correspond to registered trademarks). The same glue is for example used to fix the cap 104 to the substrate 109.

The volume of glue 112 is for example held in a well 126 delimited by the form of the cap 104. For example, the well 126 is laterally delimited by a portion of an interior surface 128 of the wall 118 of the cap 104, and by walls 130, 132 extending substantially perpendicularly from the interior surface 128. A width w between the inner surfaces of the walls 130, 132 is for example of between 50 and 300 μm.

FIG. 2 is a cross-section view of the light-emitting device 100 of FIG. 1 taken along a dashed line A-A in FIG. 1 that passes through the light source 102, the wire 106 and the contact regions 108 and 110.

As shown in FIG. 2, the cap 104 for example comprises a cover portion 202 covering the chamber 113 formed by the walls 114, 116, 118 and 120 (only the latter two walls being visible in the view of FIG. 2). The cover portion 202 is for example opaque, and has an opening 204, positioned above the light source 102, through which the light beam generated by the lights source 102 may pass. A diffuser 206 traverses the opening 202. In the example of FIG. 2, the diffuser 206 is mounted on an inner surface 208 of the rood portion 202, for example in a recess, thereby reducing the risk of the diffuser 206 becoming detached from the cap 104.

The cap 104 is fixed to the wire 106 in such a way that if the cap 104 becomes detached from the substrate 109, the wire will be broken, and the electrical connection to the light source 102 interrupted. In the example of FIGS. 1 and 2, this is achieved using the volume of glue 112, at least a portion of which for example extends between the wire 106 and the surface of the substrate 109 in order to retain the wire 106. For example, the intermediate section of the wire 106 reaches a height h of for example at least 100 μm from the surface of the substrate 109, allowing the glue 112 to enter this gap between the wire 106 and the substrate 109. In some embodiments the height h is at least 30 μm higher than the height h' of the surface of the contact region 110.

The contact area between the volume of glue 112 and the surfaces of the cap 104 is for example greater than the contact area between the volume of glue 112 and the surface of the substrate 109 and the contact region 108, and in some cases it is greater by at least 50 percent. This reduces the risk that the cap 104 could become detached while leaving the glue 112 attached to the substrate 109. Additionally or alternatively, a surface roughness of the cap 104 in the region of contact with the glue 112 could be greater than that of the substrate 109 and/or of the contact region 108 in the regions of contact with the glue 112, thereby also favoring the glue remaining with the cap 104. Additionally or alternatively, the surface of the substrate 109 that is to contact the volume of glue could be treated to render it less adhesive, for example using grease or the like.

In the example of FIG. 2, the wire 106 is attached by reverse bonding, a ball bonding 210 being formed on the contact region 108, and a stitch bonding 212 being formed on the contact region 110.

FIG. 3 is a cross-section view taken along a dashed line B-B of FIG. 1 passing through the walls 130, 132 and the volume of glue 112.

In the example of FIG. 3, the volume of glue 112 overfills the well 126, and thus forms a substantially mushroom-like form, the glue contacting top surfaces 302 and 304 of the walls 130, 132 respectively. Such an overfill provides additional anchoring of the wire 106 by the volume of glue 112. In some cases, to prevent the glue 112 from dripping onto the substrate 109 before it has hardened, the walls 130, 132 include overhanging portions 306 and 308 respectively that increase the surface area of the top surfaces 302, 304 of the walls 130, 132.

FIG. 4 is a cross-section view of the light source 102, the contact region 110, the wire 106, the volume of glue 112 and the substrate 206 similar to that of FIG. 2, except that the wire 106 is attached by forward bonding, a ball bonding 402 being formed on the contact region 110, and a stitch bonding 404 on the contact region 108.

A method of assembling the light-emitting device 100 of FIGS. 1 to 4 according to one example embodiment involves:

bonding a first end of the wire 106 to the contact region 108 of the substrate 109 and a second end of the wire 106 to the contact region 110 on the surface of the light source 102;

fixing the cap 104 to the substrate 109 such that it covers the light source 102;

depositing a liquid glue in a pattern on the substrate 109, for example covering a portion of the intermediate section of the wire 106;

placing the cap 104 on the substrate 109 such that at least two surface of the cap are brought into contact with the liquid glue. The liquid glue for example enters the well 126 and in some cases overflows; and solidifying the liquid glue to form the volume of glue 112 attaching the wire 106 to the cap 104 and for example at least partially extending between the wire 106 and the substrate 109.

FIG. 5 is a plan view of part of a light-emitting device 500 according to a further example embodiment. The device 500 is similar to the device 100, and like features have been labelled with like reference numerals and will not be described again in detail.

In the embodiment of FIG. 5, the walls 130, 132 defining the well 126 are replaced by a structure 502 comprising a hole 504 at least partially filled with the volume of glue 112. In some embodiments, an opening of the hole 504 on the exterior surface of the cap 104 includes a counter-sink 505 for receiving the glue 112.

Figure 6:
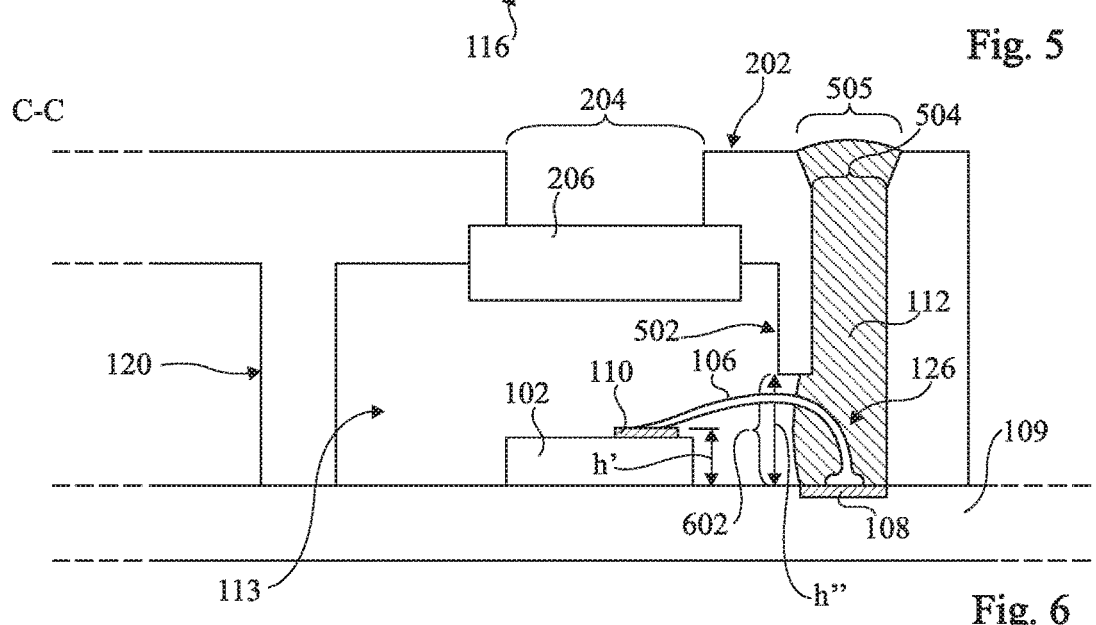
FIG. 6 is a cross-section view of the light-emitting device of FIG. 1 according to an example embodiment.

FIG. 6 is a cross-section view of the light-emitting device 500 of FIG. 5 taken along a dashed line C-C of FIG. 5 passing through the wall 120, the wire 106, the contact regions 108 and 110, and the hole 504.

It can be seen in FIG. 6 that the hole 504 extends through the cover portion 202 of the cap 104 and down to the substrate 109. The top portion of the hole 504 includes the counter-sink 505, which is for example at least partially filled with the glue 112. A bottom portion of the hole 504 defines the well 126 receiving the volume of glue 112 and through which the wire 106 passes. Thus the hole 504 is open on the exterior surface of the cap 104, allowing the glue 112 to be injected into the well 126 after the cap 104 is in position. The structure 502 includes an opening 602 on the side leading to the light source 102 through which the wire 106 passes. This opening 602 also permits the cap 104 to be positioned on the substrate 109 without interfering with the wire 106, prior to injection of the glue 112. For example, the opening 602 has a height h″ above the surface of the substrate 109 at least as high as the height h′ of the surface of the contact region 110.

In the example of FIG. 6, the volume of glue 112 fills the entire height of the hole 504 and even slightly overfills the hole 504. In alternative embodiments, the volume of glue 112 only partially fills the hole 504, for example extending from the surface of the substrate 109 and/or contact region 108 to at least cover the intermediate section of the wire 106. The amount of glue 112 is for example chosen so as to avoid the glue passing through the opening 602 and into the chamber containing the light source 102.

Figure 7:
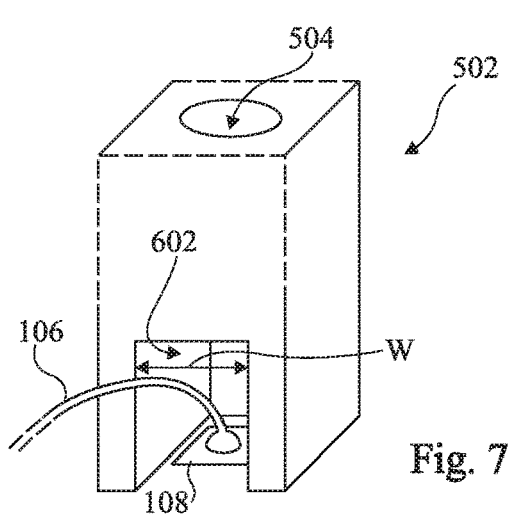
FIG. 7 is a perspective view of a glue well of a cap of the light-emitting device of FIGS. 5 and 6 according to an example embodiment.

FIG. 7 is a perspective view of the structure 502 without the glue 112. In the example of FIG. 7, the opening 602 is rectangular, although other forms would be possible. The width w of this opening is for example of between 50 and 300 μm.

A method of assembling the light-emitting device of FIGS. 5 to 7 according to one example embodiment involves:

bonding a first end of the wire 106 to the contact region 108 of the substrate 109 and a second end of the wire 106 to the contact region 110 on the surface of the light source 102;

fixing the cap 104 to the substrate 109 such that it covers the light source 102;

injecting a liquid glue into the hole 504 in the exterior surface of the cap 104 to at least partially fill the well 126 within the cap 104 through which the wire passes; and solidifying the liquid glue to form the volume of glue 112.

Figure 8:
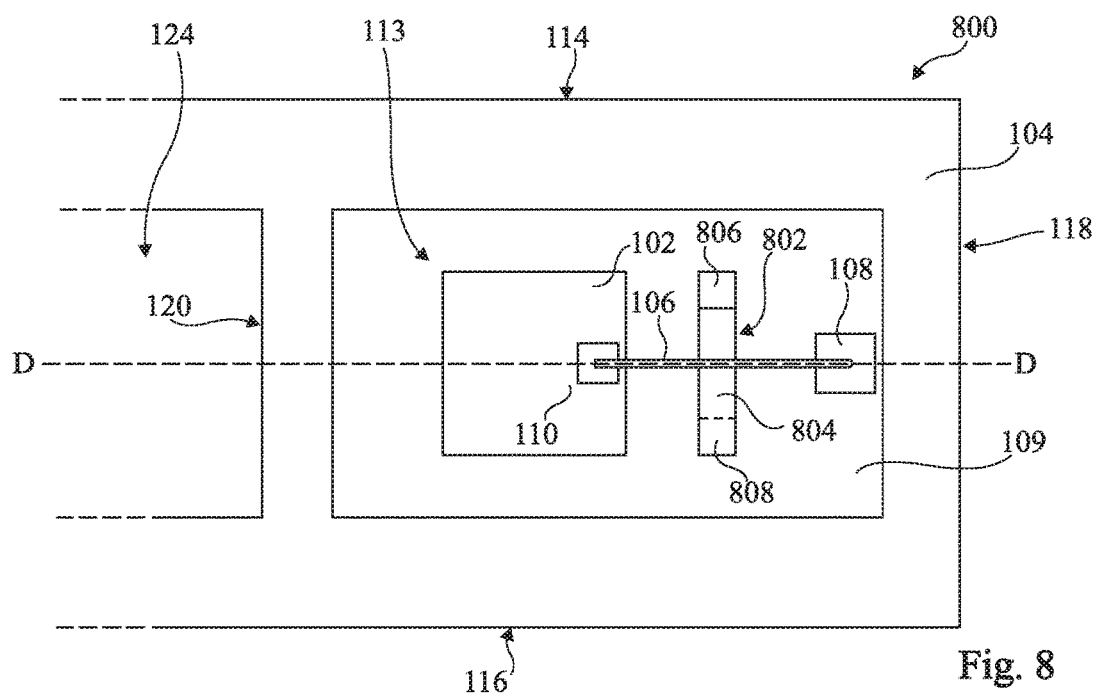
FIG. 8 is a plan view of part of a light-emitting device according to a further example embodiment of the present disclosure.

FIG. 8 is a plan view of part of a light-emitting device 800 according to yet a further example embodiment. The device 800 is similar to the device 100, and like features have been labelled with like reference numerals and will not be described again in detail.

In the embodiment of FIG. 8, the wire is hooked to the cap 104 by an arm 802 that includes a substantially horizontal portion 804 that extends between the surface of the substrate 109 and the wire 106, and one or more substantially vertical portions attached to the cap 104. For example, the arm 802 includes a vertical portion 806, and in some embodiments, a further vertical portion 808, that are attached to the cap 104, as will now be described in more detail with reference to FIGS. 9 to 12.

Figures 9, 10, 11:
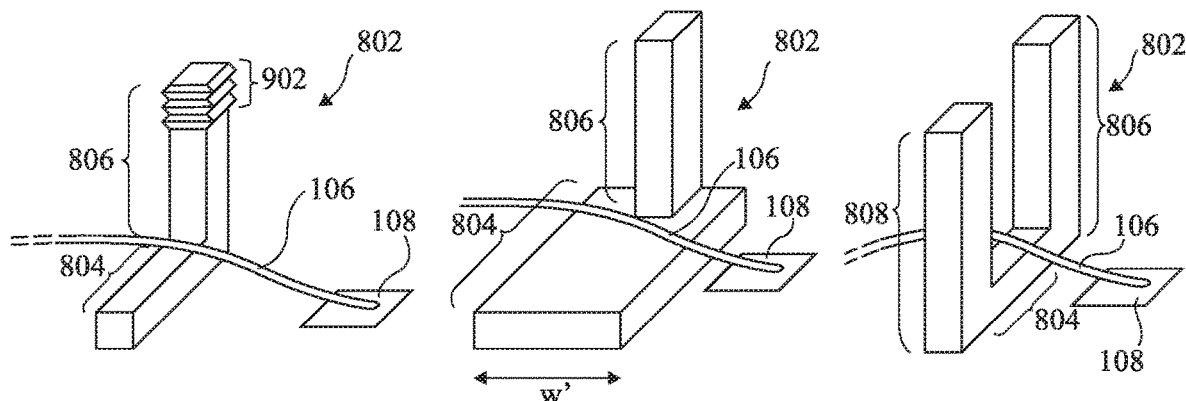
FIG. 9 is perspective view of an arm of the light-emitting device of FIG. 8 according to an example embodiment.
FIG. 10 is perspective view of an arm of the light-emitting device of FIG. 8 according to an alternative embodiment to that of FIG. 9.
FIG. 11 is perspective view of an arm of the light-emitting device of FIG. 8 according to yet a further alternative embodiment to that of FIG. 9.

FIG. 9 is a perspective view of the arm 802 according an example in which it is substantially "L" shaped. The horizontal portion 804 of the arm 802 for example rests on the surface of the substrate 109, and the wire 106 for example passes from the contact region 108 to the contact region 110 on the light source (not shown in FIG. 9) passing over the horizontal portion 804. In some embodiments, a top region 902 of the horizontal portion 806 includes a textured surface, for example horizontal ribbing, to improve adhesion to the cap 104 (not shown in FIG. 9).

The arm 802 is for example square or rectangular in cross-section, although other forms would also be possible. It for example has a width or thickness of between 100 and 200 μm, and is for example molded in plastic.

FIG. 10 is a perspective view of the arm 802 according to an alternative embodiment to that of FIG. 9, in which the horizontal portion 804 has an increased width in order to provide a stable base that is less likely to fall over during assembly. For example, the width w' of the portion 804 is at least 300 μm, and for example of between 400 μm and 800 μm.

FIG. 11 is a perspective view of the arm 802 according to a further alternative embodiment in which it is substantially "U" shaped. The horizontal portion 804 of the arm 802 for example rests on the surface of the substrate 109, and the wire 106 for example passes from the contact region 108 to the contact region 110 on the light source (not shown in FIG. 11) passing over the horizontal portion 804. The vertical portions 806 and 808 are for example both attached to the cap 104 (not shown in FIG. 11). While not illustrated in FIG. 11, both of the vertical portions 806 and 808 could include top regions that are textured, like in the embodiment of FIG. 9. Furthermore, in some embodiments, the arm 802 of FIG. 11 could be adapted to include the wider horizontal portion 804 of FIG. 10 to provide increased stability during assembly.

Figure 12:
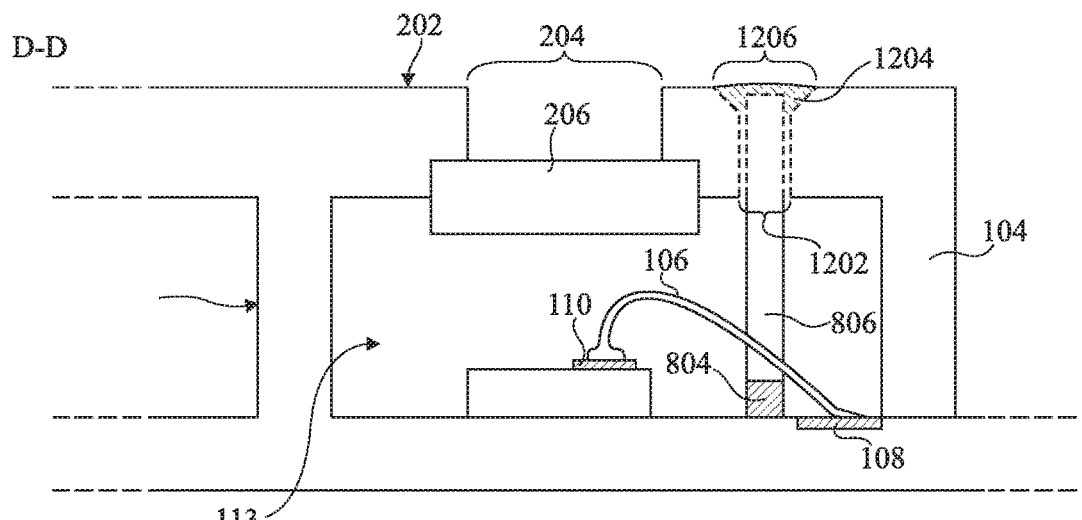
FIG. 12 is a cross-section view of the light-emitting device of FIG. 8 according to an example embodiment.

FIG. 12 is a cross-section view of the light-emitting device 800 of FIG. 8 taken along a dashed line D-D of FIG. 8 passing through the wall 120, the wire 106, the contract regions 108 and 110 and the wall 118. As represented by dashed lines in FIG. 12, the vertical section 806 of the arm 802 for example passes through a through-hole 1202 in the cover portion 202. The through-hole 1202 is for example between 50 and 100 μm wider than the arm 802, providing a tolerance for aiding the placement of the arm 802 in the through-hole 1202.

The top portion of the arm 802 is for example glued to the cap 104 at the mouth of the through-hole 1202 by glue 1204, which is for example an opaque or black glue. In some embodiments, the through-hole 1202 includes a counter-sink 1206 for receiving the glue 1204.

In the case the arm 802 has the shape of FIG. 11, the vertical portion 808 is for example fixed to the cap 104 in a similar manner to the vertical portion 806.

A method of assembling the light-emitting device of FIGS. 8 to 12 according to one example embodiment involves:

bonding a first end of the wire 106 to the contact region 108 of the substrate 109 and a second end of the wire 106 to the contact region 110 on the surface of the light source 102;

positioning the arm 802 on the surface of the substrate 109 such that it at least partially extends between the intermediate section of the wire 106 and the surface of the substrate. For example, in some embodiments, the arm 802 is temporarily attached to the substrate 109, for example by a thermal release tape such as the one marketed under the name "Revalpha" (the name "Revalpha" may correspond to a registered trademark). Such a tape can be made to lose its adhesive properties by heating, for example at between 150 and 200° C., after the cap 104 has been fixed to the substrate. Alternatively, the arm 802 of FIG. 10 could be used, having a relatively wide base portion, reducing the risk of the arm falling. Additionally or alternatively, the arm 802 could sit in a trench formed on the surface of the substrate 109;

fixing the cap 104 to the substrate 109 such that it covers the light source 102 and one end of the arm 802 extends through the through-hole 1102 in the cap; and gluing the arm to the cap 104 at least partially in the through-hole 1202.

An advantage of the embodiments described herein is that, by providing a cap that is attached or hooked to a wire that supplies the light source, the light source can be disabled in an effective and simple manner in the case that the cap becomes detached from the substrate 109.

Various embodiments and variants have been described. Those skilled in the art will understand that certain features of these embodiments can be combined and other variants will readily occur to those skilled in the art. For example, it will be apparent to those skilled in the art that while embodiments have been described in which a single wire 106 is connected between the substrate 109 and the light source 102, in alternative embodiments there could be more than one wire, each wire for example being glued or hooked to the cap. For example, two wires could provide the high and low supply voltages, or a supply voltage and an activation signal, and the light source 102 is disabled by either of these wires breaking.

Furthermore, the various embodiments could be combined. For example, it would be possible to both glue the wire 106 to the cap as described in relation with FIGS. 1 to 4 or FIGS. 5 to 7, and to also use the arm 802 as described in relation with FIGS. 8 to 12.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light-emitting device, comprising:
 a light source mounted on a substrate;
 a wire configured to provide a supply voltage or an activation signal to the light source, the wire having a first end coupled to a contact region of the substrate, a second end coupled to a contact region on a surface of the light source, and an intermediate section between the first and second ends, the intermediate section extending over a surface of the substrate;
 a cap covering the light source, the cap including a diffuser configured to diffuse light generated by the light source; and
 a volume of glue fixing the intermediate section of the wire to the cap,
 wherein the volume of glue contacts at least two surfaces of the cap, and
 wherein a total contact area between the volume of glue and the cap is greater than a contact area between the volume of glue and the substrate.

2. The light-emitting device of claim 1, wherein the volume of glue contacts at least two surfaces of the cap.

3. The light-emitting device of claim 1, wherein the total contact area between the volume of glue and the cap is at least 50 percent greater than the contact area between the volume of glue and the substrate.

4. A light-emitting device, comprising:
a light source mounted on a substrate;
a wire configured to provide a supply voltage or an activation signal to the light source, the wire having a first end coupled to a contact region of the substrate, a second end coupled to a contact region on a surface of the light source, and an intermediate section between the first and second ends, the intermediate section extending over a surface of the substrate;
a cap covering the light source, the cap including a diffuser configured to diffuse light generated by the light source; and
a volume of glue fixing the intermediate section of the wire to the cap,
wherein the volume of glue contacts at least two surfaces of the cap, and
wherein the cap comprises a well, wherein the intermediate portion of the wire passes through the well, wherein the glue is in the well.

5. The light-emitting device of claim 4, wherein a total contact area between the volume of glue and the cap is greater than a contact area between the volume of glue and the substrate.

6. The light-emitting device of claim 4, wherein the well has an opening in an exterior surface of the cap.

7. A light-emitting device, comprising:
a light source coupled to a surface of a substrate;
a wire having a first end, a second end, and an intermediate section between the first and second ends, the first end coupled to a contact region of the substrate, the second end coupled to a contact region on a surface of the light source;
a cap covering the light source and having a diffuser configured to diffuse light generated by the light source; and
an arm coupled to an inner surface of the cap, the arm being between the intermediate section of the wire and the substrate.

8. The light-emitting device of claim 7, wherein the arm has at least one end coupled to the cap.

9. The light-emitting device of claim 7, wherein the cap comprises a first through-hole, wherein a first end of the arm extends at least partially into the first through-hole.

10. The light-emitting device of claim 9, wherein the first end of the arm that extends at least partially into the first through-hole is glued to the cap in the first through-hole.

11. The light-emitting device of claim 9, wherein the cap comprises a second through-hole, wherein a second end of the arm extends at least partially into the second through-hole.

12. A method comprising:
coupling a light source to a surface of a substrate;
bonding a first end of a wire to a contact region of the substrate and a second end of the wire to a contact region on a surface of the light source, wherein an intermediate section of the wire is between the first and second ends, wherein the wire is configured to provide a supply voltage or activation signal to the light source; and
fixing a cap to the substrate,
wherein fixing the cap further includes forming a volume of glue configured to couple the intermediate section of the wire to the cap or an arm that is coupled to the cap and extends between the intermediate section of the wire and the substrate,
wherein prior to the bonding, the method comprises passing the wire through a well in the cap.

13. The method of claim 12, wherein before fixing the cap to the substrate and forming the volume of glue, the method comprises:
depositing a liquid glue over a portion of the intermediate section of the wire;
placing the cap on the substrate such that at least two surface of the cap are in contact with the liquid glue; and
solidifying the liquid glue to form the volume of glue.

14. The method of claim 12, wherein forming the volume of glue includes:
injecting a liquid glue into an opening in an exterior surface of the cap to at least partially fill the well; and
solidifying the liquid glue to form the volume of glue.

15. The method of claim 14, wherein injecting the liquid glue comprises injecting the liquid glue in the opening to fill the well.

16. A method comprising:
coupling a light source to a surface of a substrate;
bonding a first end of a wire to a contact region of the substrate and a second end of the wire to a contact region on a surface of the light source, wherein an intermediate section of the wire is between the first and second ends, wherein the wire is configured to provide a supply voltage or activation signal to the light source; and
fixing a cap to the substrate,
wherein fixing the cap further includes forming a volume of glue configured to couple the intermediate section of the wire to the cap or an arm that is coupled to the cap and extends between the intermediate section of the wire and the substrate,
wherein before fixing the cap to the substrate, the method comprises:
positioning the arm on the surface of the substrate such that the arm at least partially extends between the intermediate section of the wire and the surface of the substrate; and
placing the cap on the substrate such that at least one end of the arm extends at least partially into a through-hole in the cap.

17. The method of claim 15, further comprising gluing the at least one end of the arm to the cap in the through-hole.

18. The method of claim 12, wherein the cap includes a diffuser configured to diffuse light generated by the light source.

19. The method of claim 12, wherein the light source is a vertical-cavity surface-emitting laser.

* * * * *